(12) United States Patent
Nasiraei Moghaddam et al.

(10) Patent No.: US 10,228,435 B2
(45) Date of Patent: Mar. 12, 2019

(54) POLAR MAGNETIC RESONANCE IMAGING AND APPLICATIONS THEREOF IN CARDIAC MAGNETIC RESONANCE IMAGING

(71) Applicants: Abbas Nasiraei Moghaddam, Tehran (IR); Shokoufeh Golshani, Mashhad (IR)

(72) Inventors: Abbas Nasiraei Moghaddam, Tehran (IR); Shokoufeh Golshani, Mashhad (IR)

(*) Notice: Subject to any disclaimer, the term of this patent is extended or adjusted under 35 U.S.C. 154(b) by 0 days.

(21) Appl. No.: 15/797,291

(22) Filed: Oct. 30, 2017

(65) Prior Publication Data

US 2018/0052214 A1 Feb. 22, 2018

Related U.S. Application Data

(63) Continuation of application No. 14/944,214, filed on Nov. 18, 2015, now Pat. No. 9,835,708.

(60) Provisional application No. 62/081,318, filed on Nov. 18, 2014.

(51) Int. Cl.
*G01R 33/56* (2006.01)
*G01R 33/563* (2006.01)
*G01R 33/48* (2006.01)

(52) U.S. Cl.
CPC ... *G01R 33/56333* (2013.01); *G01R 33/4824* (2013.01)

(58) Field of Classification Search
CPC ... G06T 7/70; G06T 7/73; G06T 2207/20056; G01R 33/285; G01R 33/286; G01R 33/4824; G01R 33/4826; G01R 33/56333; G01R 35/007

See application file for complete search history.

(56) References Cited

U.S. PATENT DOCUMENTS

| | | | |
|---|---|---|---|
| 5,483,567 A | 1/1996 | Swerdloff | 378/4 |
| 6,178,271 B1 | 1/2001 | Maas, III | 382/294 |
| 6,778,847 B2* | 8/2004 | Wu et al. | 600/410 |
| 8,073,523 B2 | 12/2011 | Moghaddam et al. | 600/410 |
| 2005/0253580 A1 | 11/2005 | Huang et al. | 324/307 |
| 2013/0320978 A1 | 12/2013 | Nasiraei Moghaddam | G01R 33/543 |

FOREIGN PATENT DOCUMENTS

WO WO 2012/106574 A2 * 8/2012 ............ A61B 5/055

OTHER PUBLICATIONS

Bolster et al., "Myocardial Tagging in Polar Coordinates with Use of Striped Tags", Radiology, 177(3), Dec. 1990, pp. 769-772.*

* cited by examiner

*Primary Examiner* — Andrew W Johns
(74) *Attorney, Agent, or Firm* — NovoTechIP International PLLC

(57) ABSTRACT

A method for tagged magnetic resonance imaging is disclosed. The method includes steps of tagging an object with polar tagging patterns; acquiring data in a spatial frequency domain of the tagged object with a polar sampling pattern; and reconstructing an image of the object through a polar Fourier transform of the data acquired in the step of acquiring data.

14 Claims, 15 Drawing Sheets

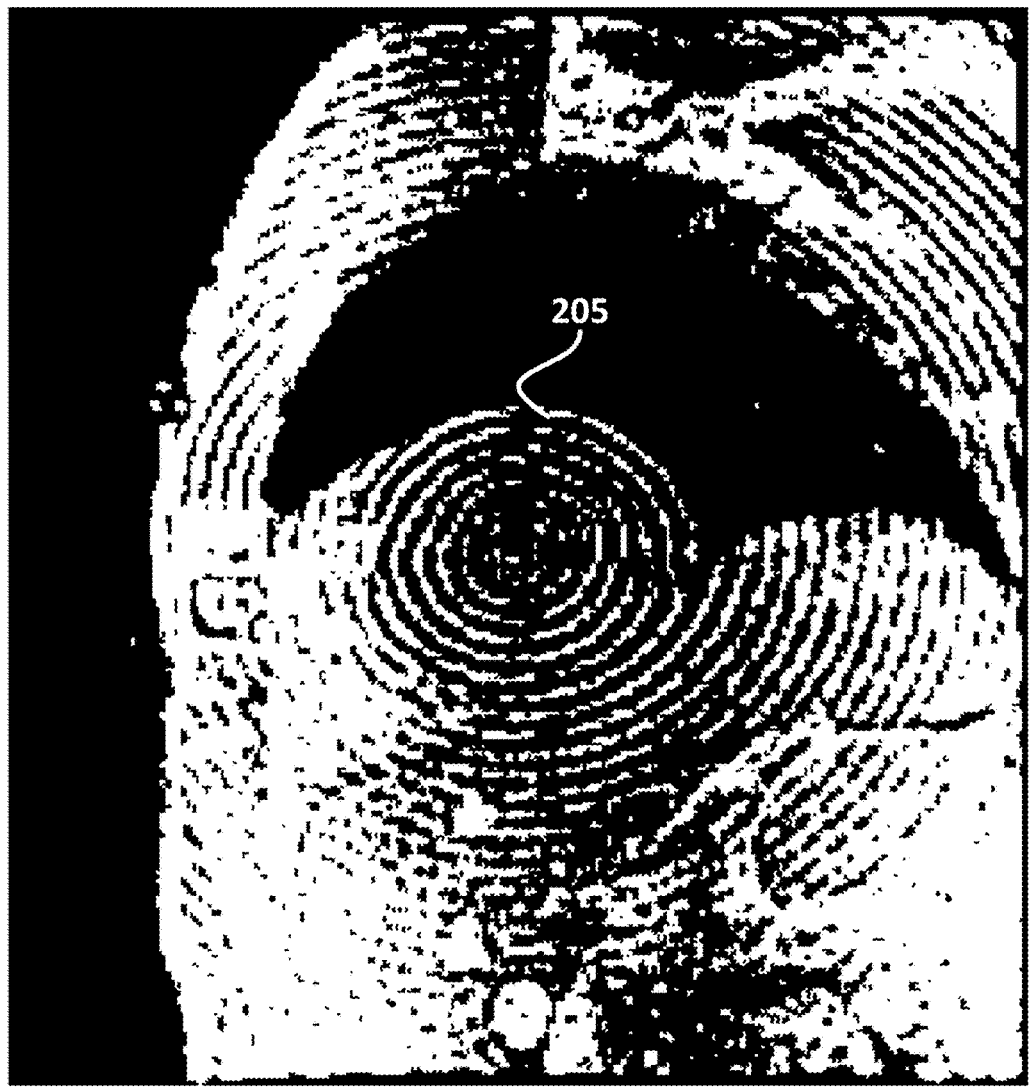
Fig. 2C

POLAR MAGNETIC RESONANCE IMAGING AND APPLICATIONS THEREOF IN CARDIAC MAGNETIC RESONANCE IMAGING

CROSS-REFERENCE TO RELATED APPLICATIONS

This application is a continuation of pending U.S. patent application Ser. No. 14/944,214, filed on Nov. 18, 2015, and entitled "POLAR MAGNETIC RESONANCE IMAGING AND APPLICATIONS THEREOF IN CARDIAC MAGNETIC RESONANCE IMAGING" which application claims the benefit of priority from U.S. Provisional Patent Application Ser. No. 62/081,318, filed on Nov. 18, 2014, and entitled "Fast and Accurate Polar Tagging of MRI Imaging for Assessment of Cardiac Function with Reduced Data Acquisition," both applications being incorporated by reference herein in their entirety.

TECHNICAL FIELD

The present application generally relates to magnetic resonance imaging, more particularly, to a method for fully polar magnetic resonance imaging and applications thereof in cardiac magnetic resonance imaging and tagged magnetic resonance imaging.

BACKGROUND

Magnetic Resonance Imaging (hereinafter "MRI") is a fascinating technique, which allows for a non-invasive assessment of the anatomy and function of the heart, without exposure to ionizing radiation. MRI offers not only high spatial resolution, but also an excellent soft-tissue contrast. MRI is recognized as the leading modality for diagnostic imaging of numerous common diseases. The outstanding properties of the MRI technique are, however, countered by a number of limitations, including but not limited to the time-consuming data acquisition, which results in lengthy examinations compared to other imaging techniques.

Tagging the object to be scanned in MRI is a useful method for the assessment and quantification of the deformations of that object. For example, a human heart (myocardium) can be tagged before cardiac magnetic resonance imaging. Myocardial tagging technique has shown to be a useful magnetic resonance modality for the assessment and quantification of local myocardial function in a healthy and in a diseased state of the heart. The act of tagging produces a variable brightness pattern in subsequent images and the deformation of that pattern over time clearly indicates tissue motion.

Tagging through the use of tag-lines is an important tool in the determination of strain in an object of interest, which lacks prominent features, for example, a human heart. The structure and motion of an object, such as the heart (left ventricle), especially in the often clinically used short axis view, adapts best to the polar coordinate system. It is, therefore, advantageous if the tagging patterns also fit the polar coordinates to facilitate the analysis and also provide a more intuitive description of the myocardial deformation.

Since one of the most concerning issues in the strain imaging is the scan time, especially in the evaluation of the cardiac function under stress test, there is a need in the art for a faster method for reconstruction of polar MRI data.

SUMMARY

The following brief summary is not intended to include all features and aspects of the present application, nor does it imply that the application must include all features and aspects discussed in this summary.

In one general aspect, the instant application describes a method for tagged magnetic resonance imaging. The method is carried out by following steps: first, an object, which is intended to be scanned is tagged with a polar tagging pattern; second, data in a spatial frequency domain of the tagged object is acquired with a polar sampling pattern; and finally, an image of the object is reconstructed through a polar Fourier transform of the data acquired in the step of acquiring data.

In another general aspect of the present application, a method for magnetic resonance imaging is described. The method is carried out by following steps: first, data in a spatial frequency domain of an object is acquired with a polar sampling pattern; and then, an image of the object is reconstructed through a polar Fourier transform of the data acquired in the step of acquiring data.

The above general aspects may include one or more of the following features. A radial tagging pattern or a circular tagging pattern may be used for tagging the object. A radial sampling pattern or a circular sampling pattern can be used for acquiring the data in the spatial frequency domain of the object.

In one implementation, the image of the object can be reconstructed through a polar Fourier transform method which is carried out by following steps: first, a Fourier transform is performed on the data acquired in the step of acquiring data, in the azimuth direction to obtain Fourier series coefficients of the data; second, Hankel transforms of the Fourier series coefficients of the data acquired in the step of acquiring data are calculated to obtain Fourier series coefficients of an image of the object; and finally a Fourier transform is performed on the Fourier series coefficients of the image of the object to obtain an image of the object in polar coordinates.

In another implementation, the obtained image of the object in polar coordinates can be re-gridded to Cartesian coordinates for display. The re-gridding can be carried out by a re-gridding method, such as interpolation.

In yet another implementation, the Hankel transforms can be calculated with orders ranging from a minimum order $n_{min}$ to a maximum order $n_{max}$, which enable a selective focusing feature.

In yet another implementation, the data is acquired using a three-dimensional data acquisition sequence, such as the stack-of-stars sequence.

In yet another general aspect of the present application, a data processing system for fast magnetic resonance imaging of an object, the system comprising a memory and a processor, the memory having executable instructions encoded thereon, such that upon execution by the processor, the processor performs operations of acquiring data in a spatial frequency domain of the object with polar sampling patterns; and reconstructing an image of the object through a polar Fourier transform of the data acquired in the step of acquiring data.

BRIEF DESCRIPTION OF THE DRAWINGS

While the specification concludes with claims particularly pointing out and distinctly claiming the subject matter that is regarded as forming the present application, it is believed that the application will be better understood from the following description taken in conjunction with the accompanying DRAWINGS, where like reference numerals designate like structural and other elements, in which:

FIG. 2C illustrates an exemplar reconstructed circularly-tagged image of a myocardium of a healthy volunteer.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

For purposes of explanation, specific nomenclature is set forth to provide a thorough understanding of the present application. However, it will be apparent to one skilled in the art that these specific details are not required to practice the application. Descriptions of specific applications are provided only as representative examples. Various modifications to the preferred implementations will be readily apparent to one skilled in the art, and the general principles defined herein may be applied to other implementations and applications without departing from the scope of the application. The present application is not intended to be limited to the implementations shown, but is to be accorded the widest possible scope consistent with the principles and features disclosed herein.

Described in this application is a method for tagged magnetic resonance imaging (MRI), and more particularly, a method for fully polar tagged MRI. As used herein, "tagged magnetic resonance imaging" refers to an MRI technique, in which the object to be scanned is tagged. The act of tagging produces a variable brightness pattern in subsequent images of the object, and the deformation of the aforementioned pattern over time, clearly indicates the deformation of the object. This could be a useful magnetic resonance modality for the assessment and quantification of, for example, the local myocardial function in a healthy and in a diseased state.

Generally, tagged magnetic resonance imaging of an object, has three main steps, namely, preparation, in which the object to be scanned is tagged; imaging, in which the data in a spatial frequency domain of the tagged object is acquired; and reconstruction of an image of the object, based on the data acquired in the imaging step. The coherency between these stages plays an important role in the efficiency of the whole tagged magnetic resonance imaging.

Figure 1:
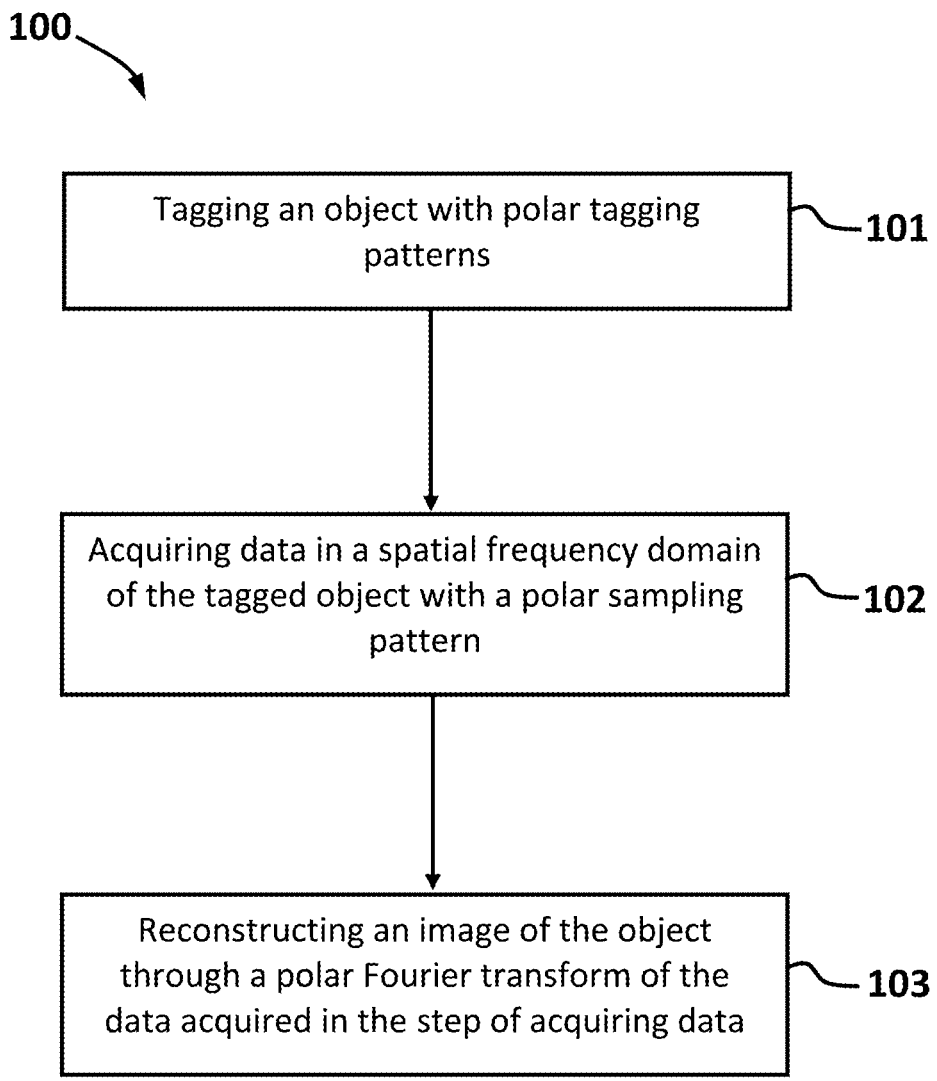
FIG. 1 is an exemplary and non-limiting method for tagged magnetic resonance imaging, according to the teachings of the present application.

FIG. 1 is an exemplary and non-limiting method 100 for tagged MRI according to the teachings of the present application. The method 100 introduced in this application allows for a coherent and efficient approach for performing the entire process of tagged MRI in the polar coordinate system. The method 100 includes the steps of tagging an object with tagging patterns that fit the polar coordinate system (step 101); acquiring data in a spatial frequency domain of the tagged object with a polar sampling pattern (step 102); and reconstructing an image of the object through a polar Fourier transform of the data acquired in the step of acquiring the data (step 103). This fully polar tagged MRI method 100 leads to acceleration in both imaging (step 102) and reconstruction (step 103), and eliminates or reduces the incoherency between the preparation (step 101), the acquisition (step 102) and reconstruction (step 103) steps of the tagged MRI method 100. Moreover, the method 100 allows for reconstructing the image of the object (according to step 103) using under-sampled spatial frequency domain (k-space) data (acquired according to step 102), which leads to accelerated imaging and reconstruction.

According to the first step (step 101) of the method 100, as described in this application, the object to be scanned is tagged with polar tagging pattern, which, for example, includes radial and circular tagging patterns. Tagging the object through the use of tag-lines is an important tool in the determination of strain in an object of interest, for example, a human heart. Since the structure and motion of an object, such as the heart (left ventricle), especially in the often clinically used short axis view, adapts best to the polar coordinate system, expressing myocardial strain in the radial and circumferential directions is preferred in clinical practice. It is, therefore, advantageous if the tagging patterns also fit the polar coordinates to facilitate the analysis and also provide a more intuitive description of the myocardial deformation. Hence, for tagging the object (step 101), sufficiently dense polar tag-lines can be generated on the myocardium. The aforementioned polar tag-lines can be generated, for example, with a radial tagging pattern, or a circular tagging pattern.

Figure 2A:
FIG. 2A illustrates an exemplar reconstructed radially-tagged image of a myocardium of a healthy volunteer.
Figure 2B:
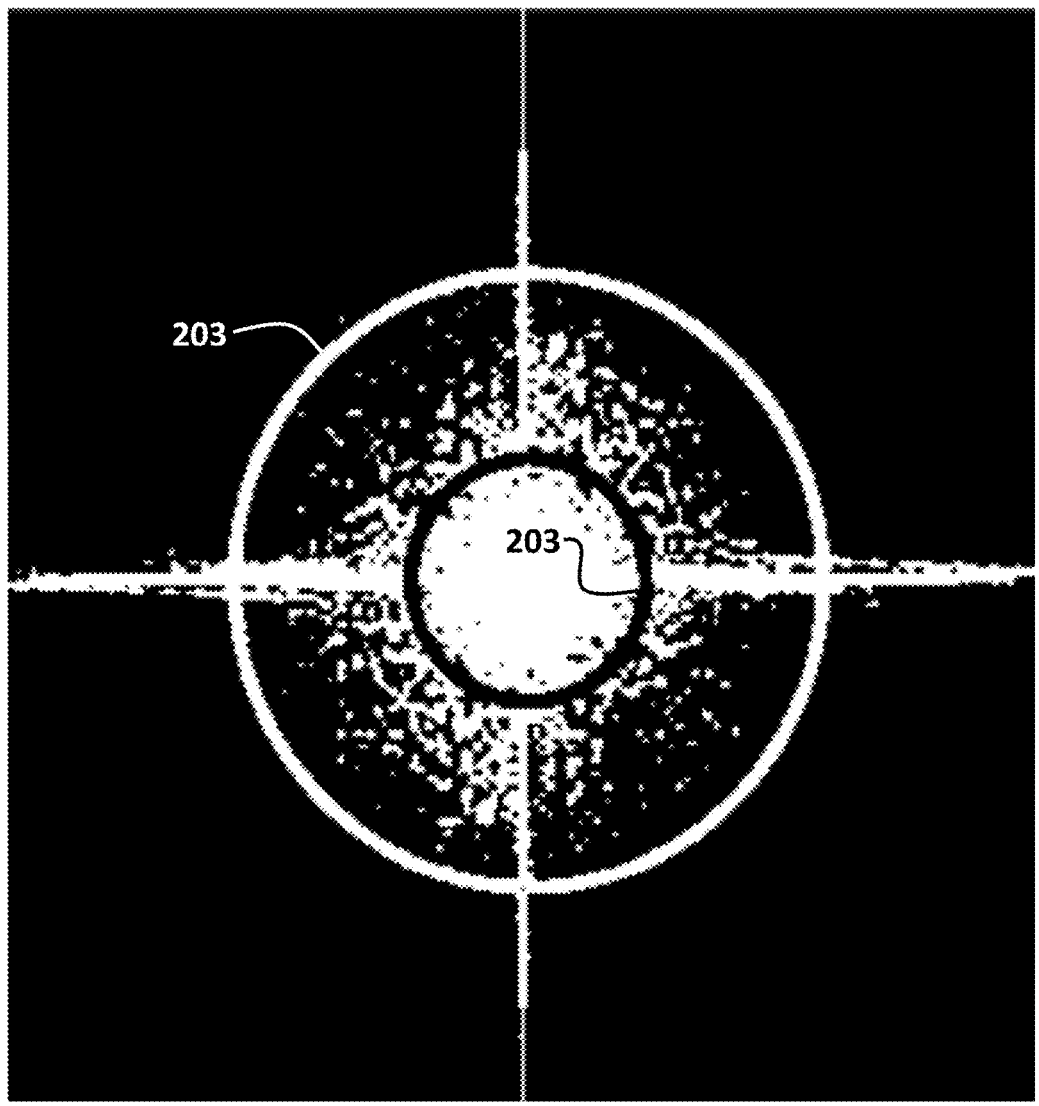
FIG. 2B illustrates the corresponding spatial frequency domain (k-space) data of the radially-tagged myocardium of FIG. 2A.

Referring to FIG. 2A and FIG. 2B, these figures illustrate generated tag-lines on a myocardium with a radial tagging pattern 200, where the tag-lines 201 are visible as dark spokes; and the corresponding spatial frequency domain data (k-space data) 202, in which, the energy of tag-lines is concentrated in a doughnut-shaped region 203.

Figure 2D:
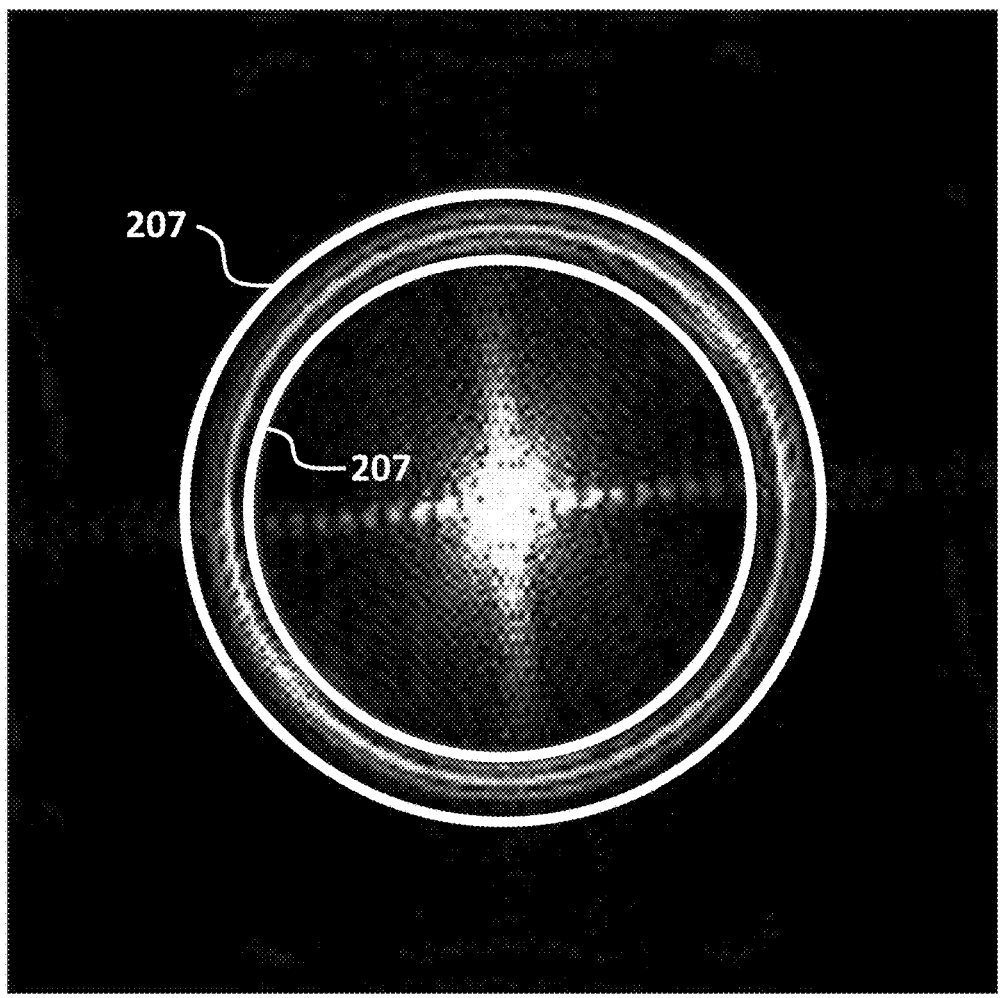
FIG. 2D illustrates the corresponding spatial frequency domain (k-space) data of the circularly-tagged myocardium of FIG. 2C.

Referring to FIG. 2C and FIG. 2D, these figures illustrate the generated tags on the myocardium with a circular tagging pattern 204, where the circular tags 205 are visible as dark circles; and the corresponding spatial frequency domain data (k-space data) 206, in which, the energy of tag-lines is concentrated in an annular sub-region 207.

In general, tag-lines, either radial 201 or circular 205, can be generated using any suitable tagging technique, a non-limiting example of which, includes modulated magnetization.

According to the second step (step 102) of the method 100, as described in this application, the data in a spatial frequency domain of the object, which is tagged according to the first step (step 101) is acquired with a polar sampling pattern. The polar sampling pattern may be, for example, a radial sampling pattern, in which the data in the spatial frequency domain of the object are acquired along radial trajectories; or a circular sampling pattern, in which the data in the spatial frequency domain of the object are acquired along circular trajectories.

The balance between sampling patterns for acquisition of k-space data and how the energy of tag-lines spreads out in k-space would have a significant impact on the efficiency of the acquisition step (step 102) in the tagged MRI method 100. Since one of the most concerning issues in the strain imaging is the scan time, especially in the evaluation of the cardiac function under stress test, selection of a fast acquisition scheme is of great importance. Therefore, polar sampling patterns are of great advantage, due to their consistency with the distribution of the radial tagging information 202 and circular tagging information 206 in k-space. For example, a radial sampling pattern can be used to acquire the spatial frequency data 202 and 206, or a circular sampling pattern can be used to acquire the spatial frequency data 202 and 206. Any spatial frequency sampling pattern can follow the tagging of the object (step 101). A fast sampling makes possible multiphase, multilayer imaging before tag-lines 201 and 205 fade.

It should be understood by a person skilled in the art that in order to make a true three-dimensional (3D) motion analysis of the heart, a 3D tagging method in combination with a 3D acquisition method can be used. For example, one interesting data acquisition sequence or trajectory is the known "stack-of-stars" sequence or trajectory, which has been derived from a conventional 3D gradient-echo (GRE) sequence.

Figure 2E:
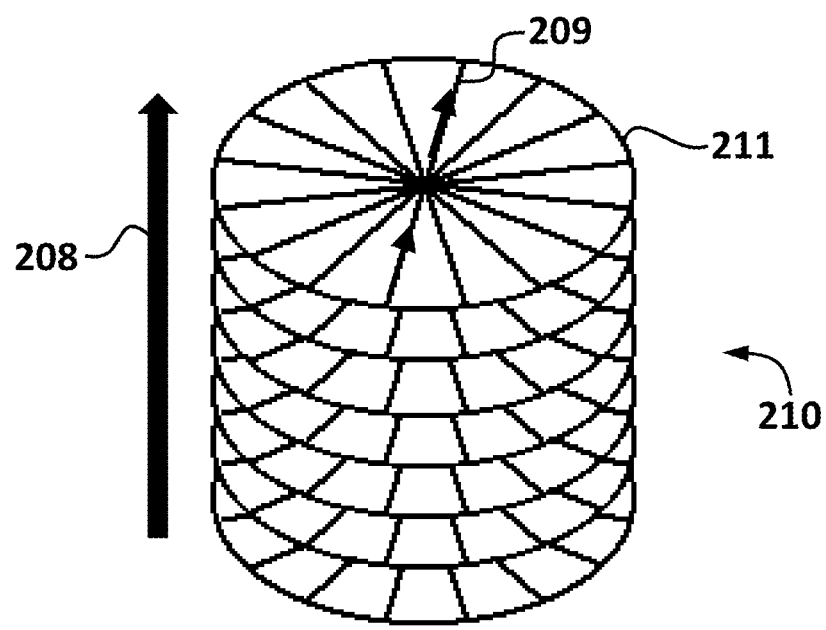
FIG. 2E illustrates an exemplar stack-of-stars trajectory.

Referring to FIG. 2E, in the stack-of-stars sequence, in the "slice" direction 208, standard Cartesian phase encoding is performed, while in the "readout" and "phase" plane (for each slice 211), data are acquired along radial spokes 209, which results in cylindrical k-space coverage 210. This k-space acquisition, which is referred to as a "3D data acquisition trajectory" hereinafter, provides motion robustness and therefore, it may be, most suitable to the dynamic imaging as cardiac tagging methods. The angle of the radial spokes can be ordered using an equidistant scheme or the golden-angle scheme.

Once the spatial frequency information 202 and 206 is available, the next step is to reconstruct an image of the object 200 and 204 based on the acquired k-space data.

According to the third step (step 103) of the method 100, as described in this application, an image of the tagged object is reconstructed through performing a polar Fourier transform of the data acquired in the second step (step 102).

The efficiency of the polar tagging and polar data acquisition depends on the employment of a fast and coherent image reconstruction technique. In MRI, the relationship between the spatial frequency data (k-space data) and the final image is a Fourier transform. When the data acquisition is carried out using a Cartesian sampling pattern, a 2D fast Fourier transform (FFT) will efficiently reconstruct the image. For reconstruction of non-Cartesian MRI data, however, this fast algorithm is not available. For radially-encoded MRI data, which is the data acquired with a radial sampling pattern, the image is usually reconstructed, using analytical methods, such as filtered back projection or performing inverse Fourier transform after re-gridding the data. The aforementioned methods introduce severe artifacts, when the number of radial spokes reduces below the well-known Nyquist sampling minimum requirement.

The method 100, which is introduced in the present application, requires a polar Fourier transform (hereinafter "PFT") of the radially and circularly sampled data. For an efficient reconstruction, the Fourier transform in the polar coordinate system, or as is referred to herein, the polar Fourier transform (PFT) can, for example, be calculated using a Hankel-transform-based reconstruction technique. The method 100 is rather fast and well consistent with the radially-tagged and circularly-tagged data, and provides images with improved quality, even when the data in the spatial frequency domain are under-sampled in the second step (step 102) for the sake of accelerating the imaging process.

In the following paragraphs, an exemplar and non-limiting algorithm is described for calculating the polar Fourier transform of the acquired k-space data in order to reconstruct the image of the object according to step three (step 103) of the method 100.

In MRI, the relationship between the spatial frequency data (k-space data) and the final image is a Fourier transform. Let $F(\rho,\varphi)$ denote the two-dimensional Fourier transform of an arbitrary function $f(r,\theta)$; therefore, the inverse Fourier transform (IFT) in polar coordinates can be expressed as the following equation, which is designated by number (1), and referred to hereinafter as equation 1:

$$f(r, \theta) = \frac{1}{2\pi} \int_{-\pi}^{\pi} \int_{0}^{\infty} F(\rho, \varphi) e^{i2\pi r \rho \cos(\theta - \varphi)} \rho d\rho d\varphi \qquad (1)$$

In equation 1 hereinabove, r and $\theta$ are the polar parameters of the spatial domain, and $\rho$ and $\varphi$ represent polar variables in the spatial frequency domain. Since $F(\rho,\varphi)$ is a periodic function of $\varphi$, it can be expanded into a Fourier series as in the following equation, which is designated by number (2), and referred to hereinafter as equation 2:

$$F(\rho, \varphi) = \sum_{n=-\infty}^{\infty} F_n(\rho) e^{in\varphi} \qquad (2)$$

In equation 2 hereinabove, $F_n(\rho)$ are Fourier-series coefficients of $F(\rho,\varphi)$ that can be calculated through a one-dimensional fast Fourier transform (1D-FFT). Substituting equation 2 in equation 1, and using the integral definition of the $n^{th}$ order Bessel function, which is:

$$J_n(x) = \frac{1}{2\pi} \int_{-\pi}^{\pi} e^{i(x\sin\beta - n\beta)} d\beta \quad (3)$$

The following equation, is obtained, which is referred to as equation 4, hereinafter:

$$f(r, \theta) = \sum_{n=-\infty}^{\infty} i^n e^{in\theta} \left( \int_0^\infty \rho F_n(\rho) J_n(2\pi\rho r) d\rho \right) \quad (4)$$

Now we have a set of functions as $F_n(\rho)$, which are independent of angular variable $\varphi$ and therefore, we may apply a Bessel-based transform on each of them similar to what we have for an inherently symmetric function. The integral in equation 4, represents the Hankel transforms of order n of the function $F_n(\rho)$. Therefore, the Fourier transform of $f(r,\theta)$ is expressed as a summation over a set of integer-order Hankel transforms. It can be inferred from Equation 4 that each of these Hankel transforms indicates a Fourier-series coefficient of the periodic function $f(r,\theta)$ as follows:

$$f(r, \theta) = \sum_{n=-\infty}^{\infty} f_n(r) e^{in\theta} \quad (5)$$

In equation 5 hereinabove, $f_n(r)$ is given by the following equation, which is referred to as equation 6:

$$f_n(r) = i^n \int_0^\infty \rho F_n(\rho) J_n(2\pi\rho r) d\rho = i^n H_n\{F_n(\rho)\} \quad (6)$$

Thus, it follows that:

$$f(r,\theta) = \text{IFFT}[f_n(r)] = \text{IFFT}[i^n H_n\{F_n(\rho)\}] = \text{IFFT}[i^n H_n\{\text{FFT}(F(\rho,\varphi))\}] \quad (7)$$

$f(r,\theta)$ is the desired image, which is reconstructed using the above-described algorithm from its polar Fourier samples $F(\rho,\varphi)$. The desired image is represented in the polar coordinate system.

Figure 3:
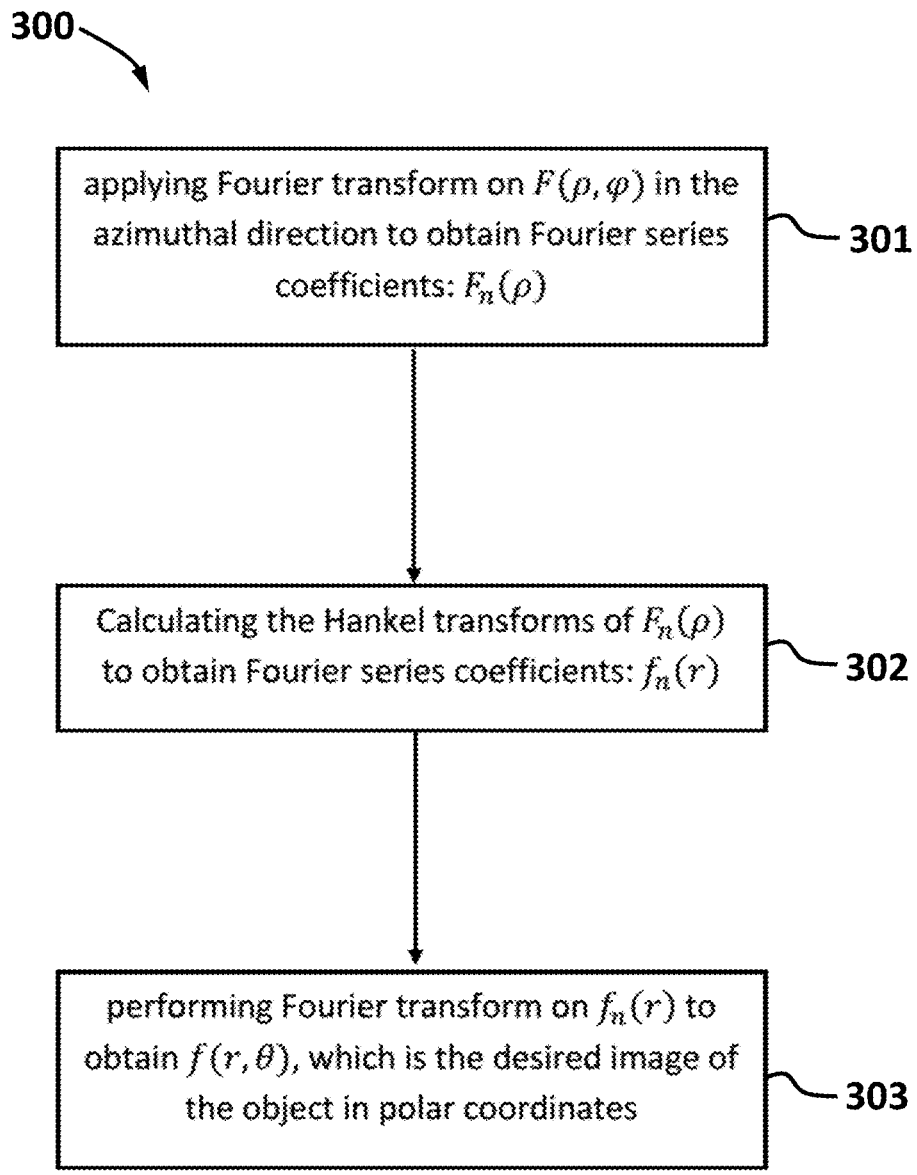
FIG. 3 is an exemplar and non-limiting polar Fourier transform algorithm, according to one implementation of the present disclosure.

Referring to FIG. 3, an exemplar PFT algorithm 300 is shown in this figure. According to this algorithm 300: first, a Fourier transform is performed on $F(\rho,\varphi)$ in the azimuthal direction to obtain Fourier series coefficients $F_n(\rho)$ (step 301); second, the Hankel transform of $F_n(\rho)$ is calculated to obtain Fourier series coefficients $f_n(r)$ (step 302); and finally, Fourier transform is performed on $f_n(r)$ to obtain $f(r,\theta)$ (step 302), which is the desired image of the object in polar coordinates.

For implementation of the algorithm 300, the k-space raw data acquired through, for example, a radial trajectory should be first reshaped into a $N_\rho \times N_\varphi$ matrix with $N_\rho$ and $N_\varphi$ representing the total number of samples in the radial and azimuthal directions, respectively. The $n^{th}$-order Bessel functions ($J_n$), which are required for the estimation of discrete Hankel transforms, can be pre-calculated and incorporated as a look-up table to substantially expedite the computations. It should be noted that the desired image $f(r,\theta)$, which is reconstructed through PFT from its polar Fourier space samples $F(\rho,\varphi)$ is also represented in the polar domain. Therefore, the PFT method is fully polar-based and requires no interpolation of data points onto the Cartesian grid before the final image is reconstructed, which results in higher accuracy and less estimation errors compared to the re-gridding approach.

Additional acceleration in computations of the algorithm 300 is achieved from a unique feature of radial tagging revealed after 1D-FFT in the azimuthal direction. Since in radial tagging, the original image is modulated with a fixed frequency in the circumferential direction, performing 1D-FFT in that direction results in a pair of highlighted lines in the consequent domain.

Figure 4:
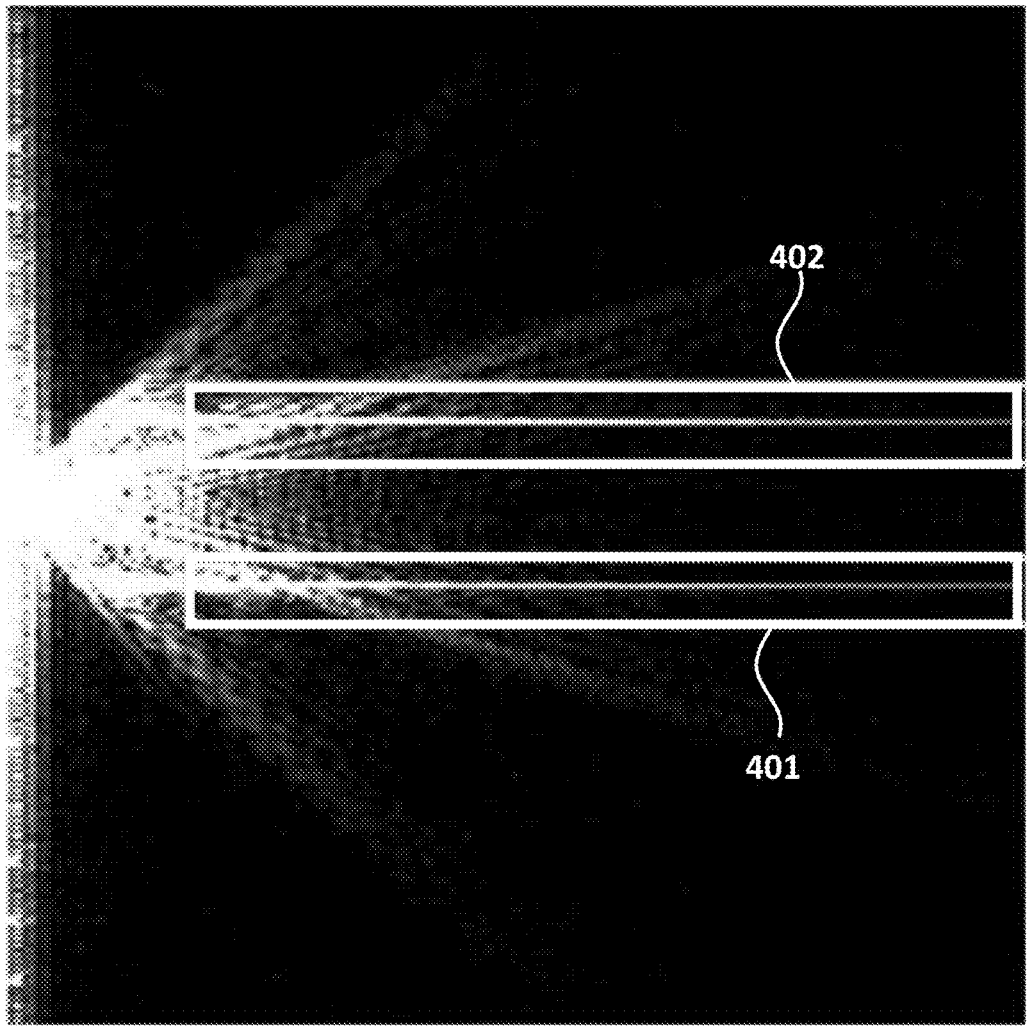
FIG. 4 illustrates the corresponding image of the spatial frequency domain data of FIG. 2B after performing a one dimensional fast Fourier transform in the azimuthal direction.

FIG. 4 illustrates the radial tagging energy after applying the first 1D FT in the azimuthal direction. The tagging energy concentrates in low-order Fourier coefficients around the tagging spatial frequency in a region enclosed in two white boxes 401 and 402. These highlighted lines, which are enclosed by two white boxes 401 and 402, represent the specific frequency of tag-lines, which contain the tagging information in the image. In post-processing analysis of tagged images, only tag-line information is required for extracting the myocardial deformation. As described in radial tagging, this information is spread over a donut-shaped region in k-space, which is then concentrated in low-order Fourier-series coefficients $F_n(\rho)$ with n close to the number of radial tag-lines in a full cycle. Therefore, by performing only low-order Hankel transforms around the tagging spatial frequency, the required information for recovery of taglines in the image will be captured and consequently high-order Hankel transforms can be neglected without losing valuable data. Thus, further acceleration in addition to the intrinsic speed of the PFT method is achievable. It should be noted that this specific property, demonstrated in the PFT method, is exclusive for radial tagging.

It should be understood that based on the details, which should be recovered in the final reconstructed image, the Hankel transforms can be calculated with orders ranging from a minimum order $n_{min}$ to a maximum order $n_{max}$, this feature of the algorithm 300 is called "selective focusing".

Figure 5:
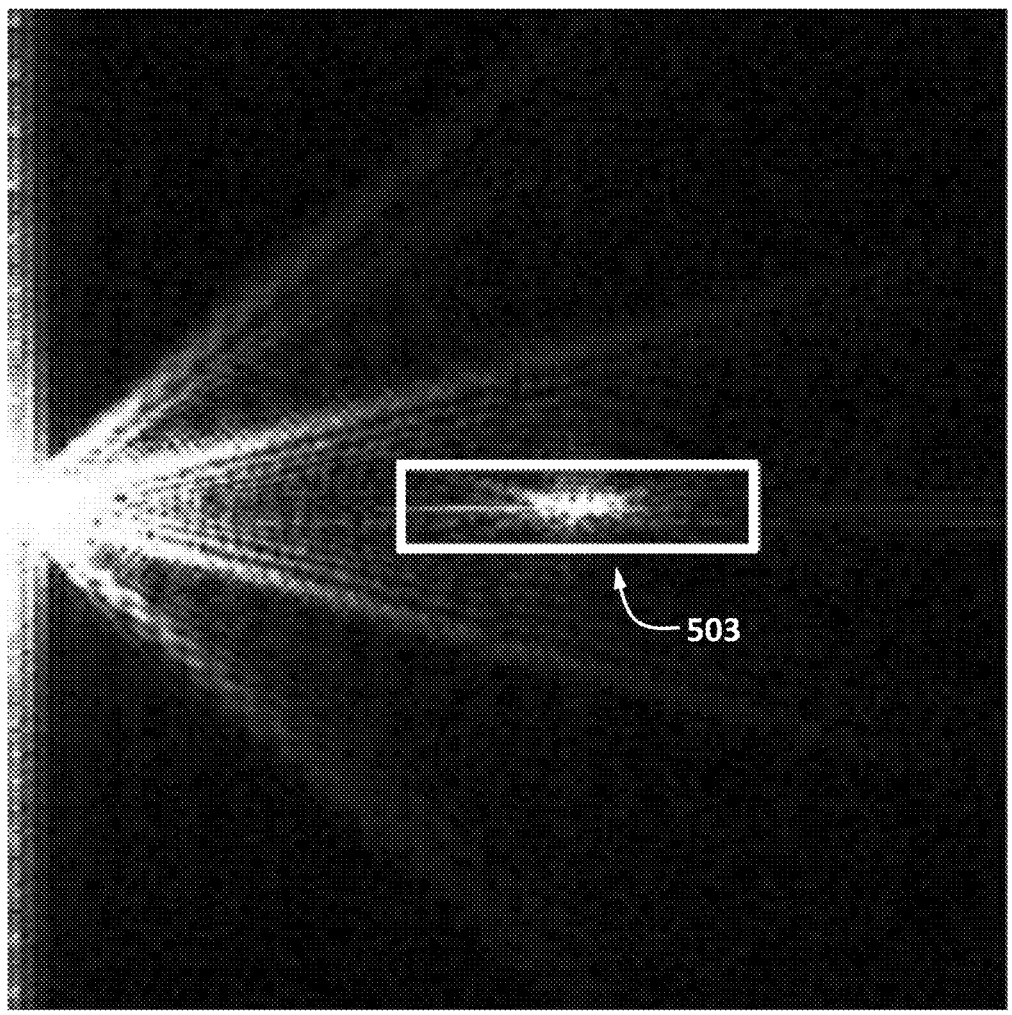
FIG. 5 illustrates the corresponding image of the spatial frequency domain data of FIG. 2D after performing a one dimensional fast Fourier transform in the azimuthal direction.

Referring to FIG. 2D and FIG. 5, since the tagging energy in circular tagging patterns lies on an annular sub-region 207 in k-space, only a limited number of k-space circles would contribute to the reconstruction of the tag-line information. Therefore, only these specific circles along with the central circles containing the overall contrast and energy of the image can be used in the calculation of the final image. The circular tagging energy after applying the first 1D FT in the azimuthal direction, concentrates in low-order Fourier coefficients around the tagging spatial frequency in a region, which is enclosed in a white box 503. Therefore, by performing only low-order Hankel transforms around the tagging spatial frequency, the required information for recovery of taglines in the image will be captured and consequently high-order Hankel transforms can be neglected without losing valuable data.

Referring to FIG. 3, FIG. 4 and FIG. 5, the middle step in the implementation of the PFT algorithm 300 is applying discrete Hankel transforms to obtain the Fourier coefficients of the final image (step 302). Required Bessel functions for the implementation of these Hankel transforms can be pre-calculated and saved as a look-up matrix in order to improve the computational speed. The number of orders which the Hankel transform needs to be calculated, basically depends on the number of radial spokes. For radial tagging, however, as the first FT concentrates taglines energy in specific Fourier-series coefficients around the spatial frequency of taglines (around the region enclosed in two white boxes 401 and 402), the Hankel transform can be calculated only for these specific orders. That is, the higher and/or lower orders can be discarded without imposing any significant loss of tagline information. It is recommended, however, not to drop the low orders if we want to have good resolution in the central part of the final image. This characteristic can be exploited to accelerate both acquisition and reconstruction of radial tagging. As used herein, a "full-rank PFT method" implies that discrete Hankel transform has been calculated up to the highest order, which is determined by the number of Fourier-series coefficients in the azimuthal direction; and a "low-rank PFT method" refers to the application of only low-order Hankel transforms in the reconstruction step.

For circular tagging, as the tagging spatial frequency is almost zero in the circumferential direction, applying 1D-FFT in that direction results in a highlighted region around the zeroth-order Fourier coefficient (the region is enclosed in a white box 503). Therefore, higher acceleration factors can be achieved for circular tagging. Also, more flexible patterns can be used for the calculation of the Bessel Functions.

Furthermore, each circle in the k-space can be reconstructed selectively and independently of other circles in order to examine its effects on the final reconstructed image. This property of the PFT reconstruction can also help in the acceleration of the post-processing of the polar tagged images.

Referring to FIG. 2E, for the tagged data, which is acquired by a three-dimensional acquisition sequence, such as the "stack-of-stars" sequence, since the sample locations along rotated spokes do not fall on an equidistant grid, it is not possible to use conventional fast Fourier transform (FFT)-based image reconstruction for radially sampled data. Therefore, after applying 1D-FFT in "slice" direction 208 to remove the Fourier encoding in this direction, polar Fourier transform (PFT) can be applied to each slice 211, separately, and a set of 2D images of the object for each slice 211 can be reconstructed utilizing the method of the instant application.

Example 1: Phantom Study

In this example, a 2D segmented k-space radial pulse sequence is used for acquisition of phantom data. A 32 channel Siemens 1.5 T TIM Avanto scanner (hereinafter "the scanner") with an eight-channel receiver coil is used for obtaining raw data. Phantom images are acquired by laying down a radial tag pattern including 11 tag-lines in a semicircle. Magnetic resonance parameters for all collected datasets are as follows: field of view (FOV) is 290 mm; slice thickness is equal to 6 mm; the temporal resolution is 43.76 milliseconds; the repetition time (TR) is 5.47 milliseconds and echo time (TE) is 2.79 milliseconds; flip angle is 15°; pixel bandwidth equals 300 Hz/pixel; the image matrix size is 150×150.

For any artifact-free reconstruction, the Nyquist sampling requirement should be satisfied and the violation of this sampling requirement, results in streaking artifacts. For an image matrix size of n×n, the Nyquist condition is reduced to $N_p = \pi n/2$, where $N_p$ is the number of required projections (spokes). Applying this criterion for the image matrix size of 150×150, the optimal number of projections is approximately 236 spokes. First, tagged phantom data were acquired with as high as 200 radial spokes in an imaging process of 21 seconds to confirm the accuracy and performance of the reconstruction algorithm of the present application. The same phantom data were then sampled with a reduced number of projections or spokes of 96, 72, 48, 32 and 24. For all radial acquisitions, raw data were exported from the scanner, with no modification, and reconstructed through the PFT method of the present application. Each coil data was reconstructed individually and then combined using the standard sum of squares approach to obtain the final desired image. For visualization purposes, the resulting images were taken into the Cartesian coordinate system for display.

The results were compared with re-gridding reconstructions, which is a common method carried out by the magnetic resonance scanner. Image quality metrics including the normalized root-mean-square error (NRMSE); cross-correlation coefficient (CC), which is a measure of similarity; tagging contrast ($C_{tag}$); and tag contrast-to-noise ratio (Tag CNR) were measured. The tagging contrast ($C_{tag}$) was quantified as the difference between the mean signal intensity of tagged and non-tagged areas within a specified region-of-interest (ROI). Tag CNR was also assessed as the $C_{tag}$ divided by the standard deviation (SD) of the noise in the background region outside the ROI. For the phantom studies, the tagged object was chosen as the ROI and the noise was measured in the background region outside the object.

Figure 6:
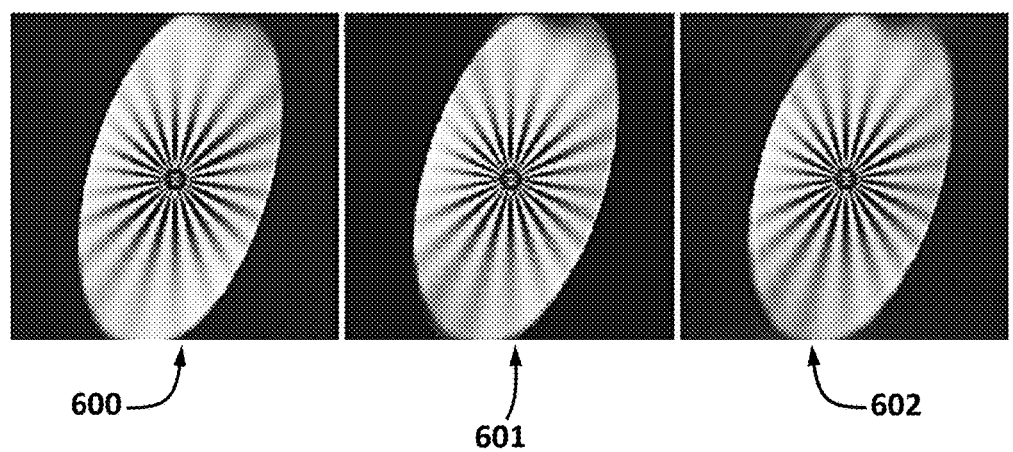
FIG. 6 illustrates the reconstructed images from the phantom study, as described in more detail in connection with example 1.

FIG. 6 illustrates the reconstructed images from the phantom study acquired with 200 radial spokes. This figure shows the image reconstructed by the re-gridding method 600; the image reconstructed by the full-rank PFT method 601, in which high-order Hankel transforms are utilized up to the $200^{th}$ order; and the image reconstructed by the low-rank PFT method 602, in which only the first 22 orders of the Hankel transforms are computed. As can be visually indicated, the quality of the image reconstructed by the full-rank PFT 601 and the image reconstructed by the low-rank PFT 602 is comparable to the image reconstructed by the re-gridding method 600.

Table 1 reports the image quality metrics, which are used to verify the accuracy and precision of the PFT algorithm of the present application. As 200 radial spokes is slightly below the Nyquist sampling requirement, the re-gridding reconstruction demonstrates no streaking artifacts and therefore, it may serve as a valid reference for the comparisons. The image reconstructed by the re-gridding technique is referred to as the reference image hereinafter. The small NRMSE values of 0.0202 for the image reconstructed by full-rank PFT and 0.0324 for the image reconstructed by the low-rank PFT indicate that the image can be reconstructed by the full-rank PFT and the low-rank PFT methods with small error in comparison with the reference image. CC values of 0.9972 for the image reconstructed by the full-rank PFT and 0.9868 for the image reconstructed by the low-rank PFT, indicate high similarity among the images obtained via PFT reconstructions and the reference image. As is reported in Table 1, the images which are reconstructed by the full-rank PFT and the low-rank PFT exhibit relatively higher tagging contrast and tag CNR, compared to the image which is reconstructed by the re-gridding technique. In addition, the low-rank PFT method can successfully reconstruct images within an acceptable error range. The small error in the image reconstruction by the low-rank PFT method is mostly related to the details at points farthest from the center of the image, rather than the details of the taglines, therefore, the quality of the image around the center, which is the area of interest is intact. The image reconstruction step, which is carried out utilizing the low-rank PFT method is 11 fold faster than the image reconstruction via the full-rank PFT, considering the direct calculation of Bessel functions.

TABLE 1

| Image reconstructed by | NRMSE | CC | $C_{tag}$ | Tag CNR |
|---|---|---|---|---|
| Re-gridding (reference) | — | — | 69.1007 | 4.9067 |
| Full-rank PFT | 0.0202 | 0.9972 | 70.0135 | 5.3861 |
| Low-rank PFT | 0.0324 | 0.9868 | 68.9272 | 5.2488 |

Figure 7:
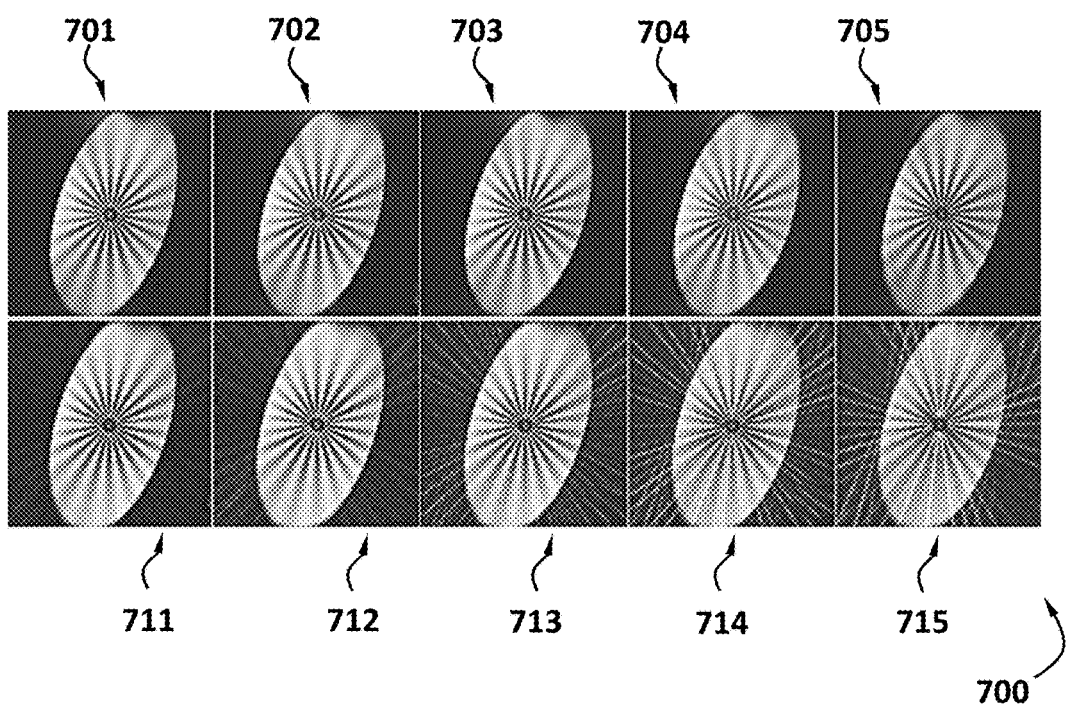
FIG. 7 illustrates the phantom images, which are reconstructed by the polar Fourier transform method, as described in more detail in connection with example 1.

FIG. 7 illustrates the phantom images 700, which are reconstructed by the PFT method performed on the data sampled with 96 spokes 701, 72 spokes 702, 48 spokes 703, 32 spokes 704, and 24 spokes 705; and the phantom images 700, which are reconstructed by the re-gridding technique performed on the data sampled with 96 spokes 711, 72 spokes 712, 48 spokes 713, 32 spokes 714, and 24 spokes 715. The corresponding acquisition times ranged from 2.5 seconds for the data acquired with 24 spokes to 10 seconds for the data acquired with 96 spokes. As can be seen in this figure, the images reconstructed by the re-gridding technique 711, 712, 713, 714, and 715, suffer from severe streaking artifacts as the under-sampling factor increases, such that the tagging structures are not properly recovered for the data sampled with lower numbers of radial spokes. On the contrary, in the images, which are reconstructed by the PFT method of this application, only some blurring effects in the peripheral areas of heavily under-sampled images, with the number of spokes as few as 32 become visible. This blurring, however, has no considerable impact on the quality of taglines, which is the feature of interest in the tagged magnetic resonance imaging.

Example 2: In-Vivo Study

In this example, a 2D segmented k-space radial pulse sequence is used for acquisition of human heart (myocardium) data. A 32 channel Siemens 1.5T TIM Avanto scanner with a five array receiver coil is used for obtaining raw data. For the in-vivo study, the data were sampled with a reduced number of projections of 88, 64, 40 radial spokes. Magnetic resonance parameters for all collected data-sets are as follows: field of view (FOV) is 290 mm; slice thickness is equal to 6 mm; repetition time (TR) is 5.76 milliseconds and echo time (TE) is 2.79 milliseconds; flip angle is 15°; pixel bandwidth equals 300 Hz/pixel; the image matrix size is 150×150.

For all radial acquisitions, raw data were exported from the scanner, with no modification, and reconstructed through the PFT method of the present application. Each coil data was reconstructed individually and then combined using the standard sum of squares approach to obtain the final desired image. For visualization purposes, the resulting images were taken into the Cartesian coordinate system for display.

The results were compared with re-gridding reconstructions by the magnetic resonance scanner. Image quality metrics including the normalized root-mean-square error (NRMSE); cross-correlation coefficient (CC), which is a measure of similarity; tagging contrast ($C_{tag}$); and tag contrast-to-noise ratio (Tag CNR) were measured. The tagging contrast ($C_{tag}$) was quantified as the difference between the mean signal intensity of tagged and non-tagged areas within a specified region-of-interest (ROI). Tag CNR was also assessed as the $C_{tag}$ divided by the standard deviation (SD) of the noise in the background region outside the ROI.

Figure 8:
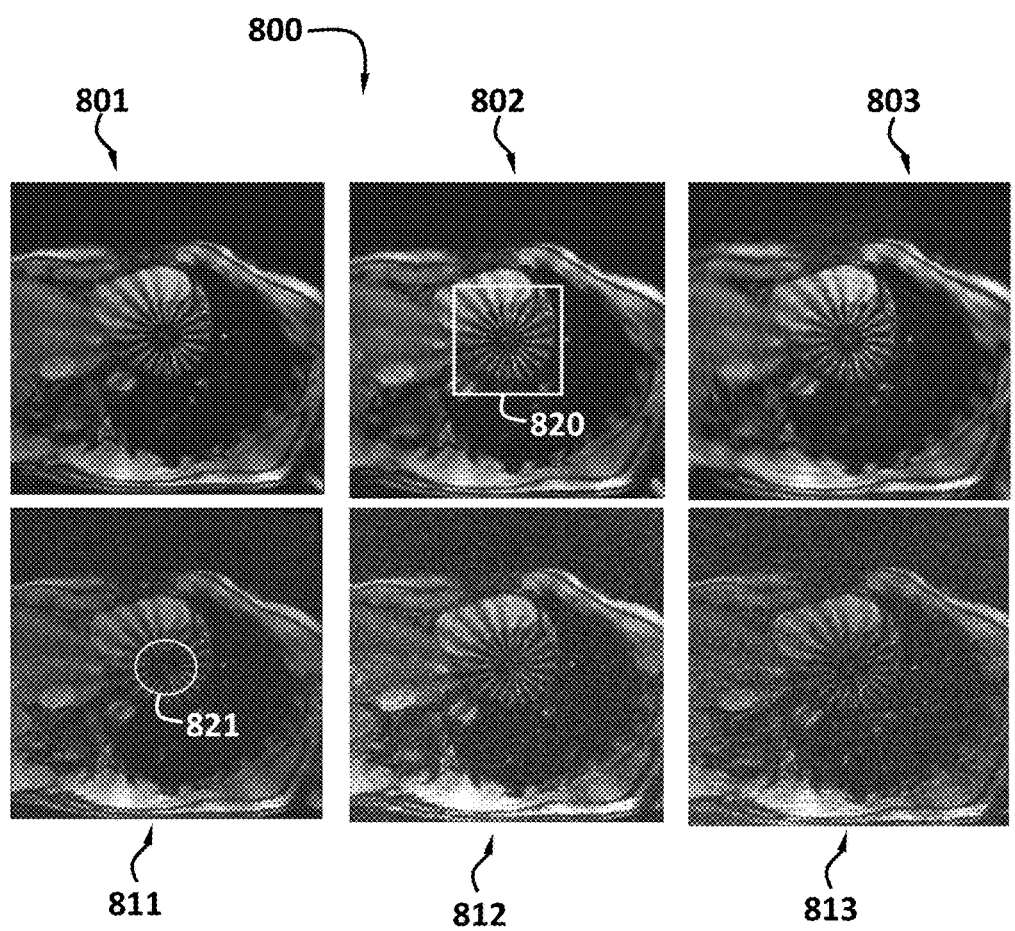
FIG. 8 illustrates the human heart (myocardium) images, which are reconstructed by the full-rank polar Fourier transform method, as described in more detail in connection with example 2.

FIG. 8 illustrates human heart (myocardium) images 800, which are reconstructed by the full-rank PFT method, which is performed on the data sampled with 88 spokes 801, 64 spokes 802, 40 spokes 803 and the corresponding images 800, which are reconstructed by the re-gridding technique, which is performed on the data sampled with 88 spokes 811, 64 spokes 812, 40 spokes 813. In all human heart (myocardium) images 800, the selected ROI was defined as the tagged myocardium area that falls in the 80×80 mm² window at the center of the image, which is specified by a white square 820. The noise was determined in the air outside the body. Further, the spatial resolution of the images has been evaluated by the sharpness of taglines on a circle 821 placed on the myocardial wall that shows how rapid the variations in the signal intensity profile take place, and therefore indicates the maximum frequency content of the image.

Figure 9:
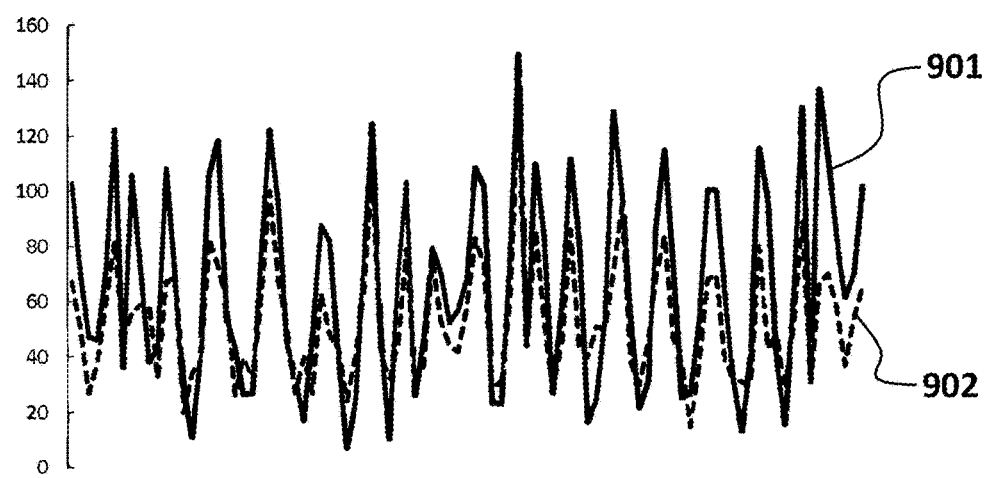
FIG. 9 illustrates the signal intensity profile for a human heart (myocardium) image, which is reconstructed by the full-rank polar Fourier transform method, as described in more detail in connection with example 2.

FIG. 9 illustrates the signal intensity profile for the human heart (myocardium) image reconstructed by the full-rank PFT method 901 and for the human heart (myocardium) image reconstructed by the re-gridding technique 902. The signal intensity profile is plotted for a specific area in the reconstructed image as designated by the circle 821 located in the tagged myocardium. The aforementioned signal intensity profile can be used as an indicator of the sharpness of the tag-lines and it can be used to measure the image quality. Wherever frequency content is higher, the sharpness of profile is higher. The re-gridding technique and the full-rank PFT method are performed on the data sampled with 88 spokes, which is acquired during a 12 s breath-hold period. The average slope of the transition between the signal intensity in tagged and non-tagged areas per pixel is 16.8608 for the images reconstructed by the full-rank PFT and 9.0520 for those reconstructed by the re-gridding images, which demonstrates improvements in terms of spatial resolution in the images reconstructed by the full-rank PFT method.

Referring to FIG. 8, the re-gridding reconstruction caused some slight artifacts in the images and the resulting images 811, 812, and 813 are much noisier when compared to the images reconstructed by the full-rank PFT method 801, 802, and 803. An effective increase of 70% in tagging contrast and 250% in contrast-to-noise ratio (CNR) was achieved by the full-rank PFT reconstruction compared to the re-gridding technique. The average runtime of the algorithm for each cardiac frame was 117.74 s with the direct computation of Bessel functions and 0.51 s when the required Bessel functions were pre-calculated.

Table 2 reports the image quality metrics, which are used to verify the accuracy and precision of the PFT algorithm of the present application. Each image is compared to its corresponding dataset obtained with 88 radial spokes. The comparison takes place on an 80×80 mm² window in the tagged region of interest 820. The tagging contrast ($C_{tag}$) is calculated only for myocardium in this region 820.

TABLE 2

| Images reconstructed by | Number of radial spokes | NRMSE | $C_{tag}$ | Tag CNR |
|---|---|---|---|---|
| PFT | 64 | 0.0166 | 55.3536 | 6.3487 |
| | 40 | 0.0183 | 53.1254 | 4.1850 |
| Re-gridding | 64 | 0.0493 | 22.6692 | 1.2208 |
| | 40 | 0.0671 | 20.6184 | 0.8611 |

Images from the re-gridding and PFT approaches were compared with their corresponding reconstructions from 88 spokes. Again, the high robustness of the PFT method is established and a high tagging contrast and tag CNR are observed for all PFT images. The average reconstruction time for each frame was 0.36 s for images reconstructed from 64 radial spokes; and 0.28 s for images reconstructed from 40 radial spokes.

Figure 10:
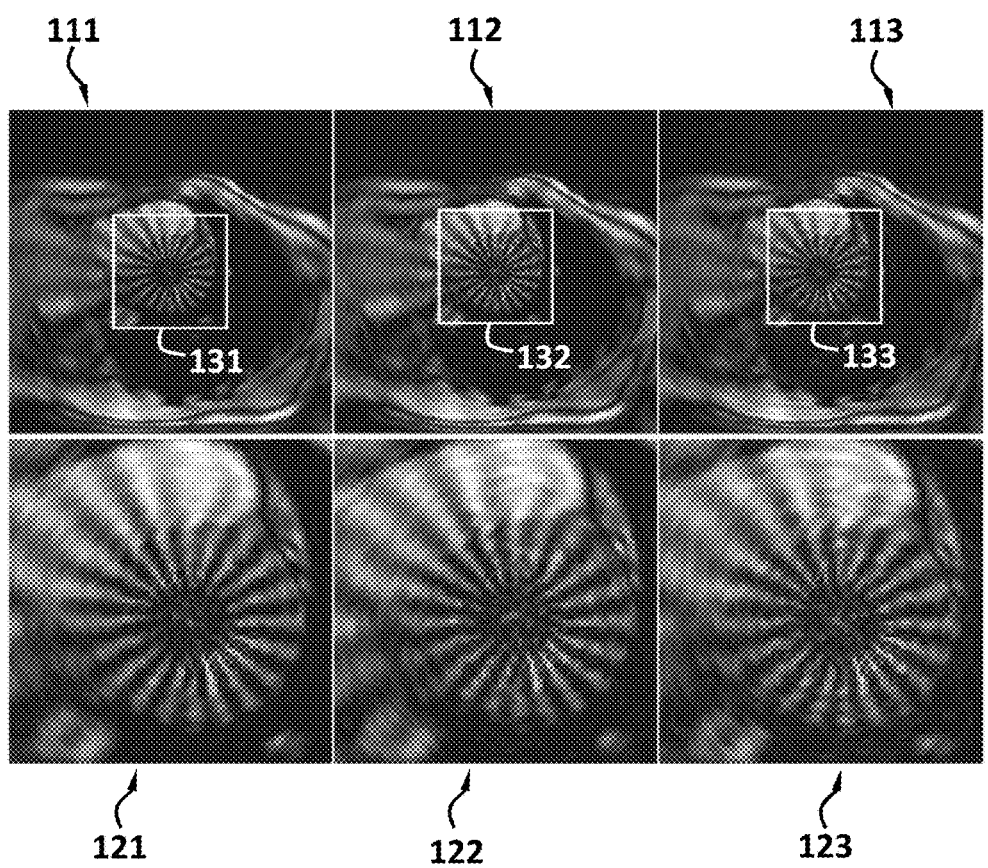
FIG. 10 illustrates the human heart (myocardium) images, which are reconstructed by the low-rank polar Fourier transform method, as described in more detail in connection with example 2.

FIG. 10 illustrates images of human heart (myocardium), which are reconstructed by the low-rank PFT method of the present application performed on the data acquired with 88 radial spokes 111, 64 radial spokes 112, and 40 radial spokes 113. It is easily recognizable that in spite of the loss of some structural details, the overall shape and quality of the taglines within the regions of interest 131, 132, and 133 have been retained. For the image reconstructed by performing the low-rank PFT on the data acquired with 88 spokes, the normalized RSME is 0.0165; for the image reconstructed by performing the low-rank PFT on the data acquired with 64 spokes, the normalized RSME is 0.0204; and for the image reconstructed by performing the low-rank PFT on the data acquired with 40 spokes, the normalized RSME is 0.0258. The reconstructed image from 88 spokes by the Full-rank PFT was considered as the reference. Again the comparisons took place on the area of interest specified by white squares 131, 132, and 133, where the tagged myocardium is located, since we are interested in mapping taglines within an acceptable range of errors. Enlarged images of the tagged myocardium in the area of interest are illustrated in FIG. 10 for the image reconstructed by the low-rank PFT performed on the data acquired with 88 radial spokes 121, 64 radial spokes 122, and 40 radial spokes 123. The low-rank PFT method also yields an appreciable improvement in the Tag CNR. The Tag CNR value for the image reconstructed by the low-rank PFT performed on the data acquired with 88 radial spokes is 7.7305; the Tag CNR value for the image reconstructed by the low-rank PFT performed on the data acquired with 64 radial spokes is 6.5909; and the tag CNR value for the image reconstructed by the low-rank PFT performed on the data acquired with 40 radial spokes is 5.0769. The Low-rank PFT implementation took 18.2 s with direct calculation of required Bessel functions.

Figure 11:
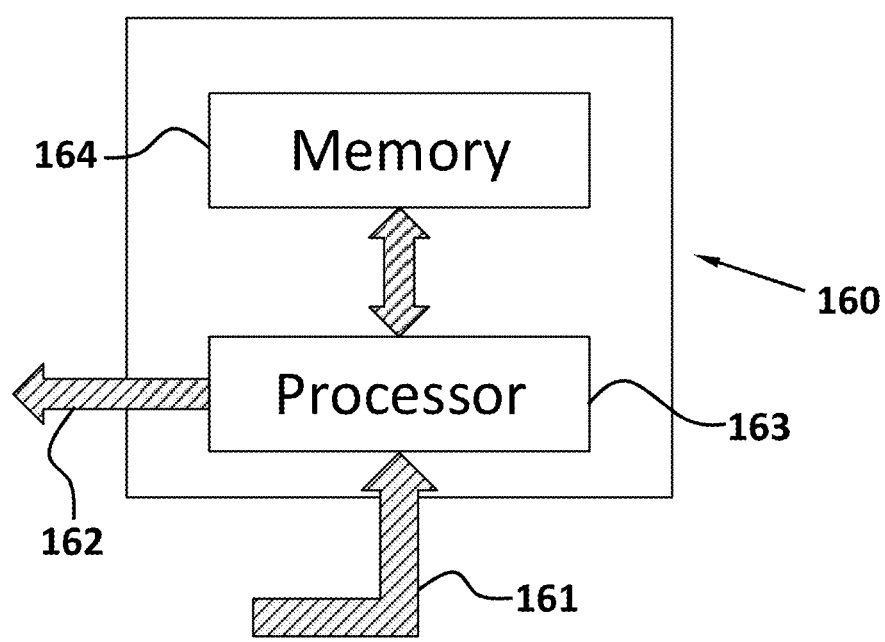
FIG. 11 is a block diagram of a data processing system.

FIG. 11 is a block diagram depicting the components of a data processing system for carrying out the method, which is introduced in the present disclosure. The data processing system 160 includes an input 161 for receiving data regarding the images. The input 161 may include multiple "ports." Typically, the input 161 is received from an MRI scanner. An output 162 provides the reconstructed image to a user or to other systems, devices, or other programs for use therein. The input 161 and the output 162 are both coupled with a processor 163, which may be a general-purpose computer processor or a specialized processor designed specifically for use with the data processing system of this disclosure. The processor 163 is coupled with a memory 164 to permit storage of data and software that are to be manipulated by commands to the processor 163. The memory 164 has executable instructions encoded thereon, such that upon execution by the processor 163, the processor 163 performs steps of acquiring the data in a spatial frequency domain of the object with polar sampling patterns; and reconstructing an image of the object, through a polar Fourier transform of the acquired data.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 105 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus the following claims are hereby incorporated into the Detailed Description, with each claim standing on its own as a separately claimed subject matter.

What is claimed is:

1. A method for tagged magnetic resonance imaging, the method comprising:
   tagging an object with polar tagging patterns that fit a polar coordinate system, thereby generating polar taglines on the object; and
   acquiring data in a spatial frequency domain of the tagged object with a polar sampling pattern.

2. The method according to claim 1, wherein tagging the object with polar tagging patterns includes tagging the object with radial tagging patterns.

3. The method according to claim 1, wherein tagging the object with polar tagging patterns includes tagging the object with circular tagging patterns.

4. The method according to claim 1, wherein generating polar tag-lines on the object includes generating polar tag-lines on the object using a modulated magnetization.

5. The method according to claim 1, further comprising reconstructing an image of the tagged object.

6. The method according to claim 5, wherein reconstructing the image of the tagged object includes reconstructing the image of the tagged object through a polar Fourier transform of the data acquired in the acquiring step.

7. The method according to claim 6, wherein reconstructing the image of the object includes:
performing Fourier transform on the data acquired in the acquiring step, in an azimuth direction to obtain Fourier series coefficients of the data acquired in the acquiring step;
calculating Hankel transforms of the Fourier series coefficients of the data acquired in the acquiring step to obtain Fourier series coefficients of an image of the object; and
performing Fourier transform on the Fourier series coefficients of the image of the object to obtain an image of the object in polar coordinates.

8. The method according to claim 7, further comprising re-gridding the image of the object in polar coordinates to Cartesian coordinates for display.

9. The method according to claim 7, wherein calculating the Hankel transforms includes calculating Hankel transforms from a lower order of $n_{min}$ up to a higher order of $n_{max}$.

10. The method according to claim 7, wherein the object includes a heart.

11. The method according to claim 1, wherein the polar sampling pattern includes a radial sampling pattern.

12. The method according to claim 1, wherein the polar sampling pattern includes a circular sampling pattern.

13. The method according to claim 1, wherein acquiring the data includes acquiring the data using a three-dimensional data acquisition sequence.

14. The method according to claim 13, wherein the three-dimensional data acquisition sequence includes a stack-of-stars sequence.

* * * * *